(12) United States Patent
Tseng et al.

(10) Patent No.: US 9,136,843 B2
(45) Date of Patent: Sep. 15, 2015

(54) THROUGH SILICON VIA REPAIR CIRCUIT OF SEMICONDUCTOR DEVICE

(71) Applicant: Industrial Technology Research Institute, Hsinchu (TW)

(72) Inventors: Pei-Ling Tseng, Miaoli County (TW); Keng-Li Su, Hsinchu County (TW); Chih-Sheng Lin, Tainan (TW); Shyh-Shyuan Sheu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/447,531

(22) Filed: Jul. 30, 2014

(65) Prior Publication Data

US 2014/0340113 A1    Nov. 20, 2014

Related U.S. Application Data

(63) Continuation-in-part of application No. 13/867,122, filed on Apr. 21, 2013.

(30) Foreign Application Priority Data

Nov. 26, 2013 (TW) .............................. 102142945 A

(51) Int. Cl.
*H03K 19/00* (2006.01)
*H03K 19/003* (2006.01)
(Continued)

(52) U.S. Cl.
CPC .............. *H03K 19/003* (2013.01); *G01R 31/28* (2013.01); *H03K 19/0008* (2013.01); *H01L 22/22* (2013.01); *H01L 2225/06541* (2013.01)

(58) Field of Classification Search
CPC ........... H01L 2224/32145; H01L 2224/16145; H01L 25/0657; H01L 2225/06541; H01L 2924/10253; H01L 23/481; H01L 2224/1308; H01L 2924/01014; H01L 2924/14; H01L 2924/1434; G11C 11/4096; G11C 29/1201; G11C 7/10; H03K 19/003
See application file for complete search history.

(56) References Cited

U.S. PATENT DOCUMENTS 7,977,962 B2   7/2011   Hargan et al.
8,110,892 B2   2/2012   Lee et al.
(Continued)

FOREIGN PATENT DOCUMENTS

| CN | 102467964 A | 5/2012 |
|---|---|---|
| TW | 201201218 | 5/2011 |
| WO | WO 2013095673 A1 | 6/2013 |

OTHER PUBLICATIONS

Uksong Kang et al., "8 Gb 3-D DDR3 DRAM Using Through-Silicon-Via Technology," IEEE Journal of Solid-State Circuits, Jan. 2010, pp. 111-119, vol. 45, No. 1, IEEE, US.
(Continued)

*Primary Examiner* — Vibol Tan

(57) ABSTRACT

TSV repair circuit of a semiconductor device includes a first chip, a second chip, at least two TSV, at least two data path circuits and an output logic circuit. Each data path circuit comprises an input driving circuit, a TSV detection circuit, a memory device, a protection circuit and a power control circuit. The TSV detection circuit detects a TSV status, the memory device keeps the TSV status, the protection circuit determines whether to pull a first end of the TSV to a ground voltage according to the TSV status, and the power control circuit prevents a leakage current of a power voltage from flowing through a substrate.

26 Claims, 7 Drawing Sheets

(51) Int. Cl.
*G01R 31/28* (2006.01)
*H01L 21/66* (2006.01)

(56) References Cited

U.S. PATENT DOCUMENTS

| | | | |
|---|---|---|---|
| 8,339,879 B2 | 12/2012 | Choi et al. | |
| 8,384,417 B2 | 2/2013 | Laisne et al. | |
| 8,689,065 B2* | 4/2014 | Park et al. | 714/723 |
| 8,713,349 B2* | 4/2014 | Byeon et al. | 713/502 |
| 8,839,161 B2* | 9/2014 | Shibata et al. | 716/101 |
| 2010/0060310 A1 | 3/2010 | Laisne et al. | |
| 2010/0127758 A1 | 5/2010 | Hollis | |
| 2010/0295600 A1 | 11/2010 | Kim et al. | |
| 2012/0012841 A1 | 1/2012 | Chang et al. | |
| 2013/0002272 A1 | 1/2013 | Badaroglu et al. | |
| 2013/0093454 A1 | 4/2013 | Lai et al. | |
| 2014/0003171 A1* | 1/2014 | Ko | 365/194 |
| 2014/0145753 A1* | 5/2014 | Tseng et al. | 326/9 |
| 2014/0184322 A1* | 7/2014 | Tseng et al. | 327/566 |

OTHER PUBLICATIONS

Li Jiang et al., "On Effective TSV Repair for 3D-Stacked ICs," Design, Automation & Test in Europe Conference & Exhibition, Mar. 2012, pp. 793-798, IEEE, US.

Menglin Tsai et al., "Through Silicon Via (TSV) Defect/Pinhole Self Test Circuit for 3D-IC," IEEE International Conference on 3D System Integration, Sep. 2009, pp. 1-8, IEEE, US.

Ang-Chih Hsieh, et al., "TSV Redundancy: Architecture and Design Issues in 3D IC," Design Automation & Test in Europe Conference & Exhibition, Mar. 2010, pp. 166-171, IEEE, US.

Loi, I. et al., "A Low-overhead Fault Tolerance Scheme for TSV-based 3D Network on Chip Links," Computer-Aided Design, Nov. 2008, pp. 598-602, IEEE, US.

* cited by examiner

US 9,136,843 B2

THROUGH SILICON VIA REPAIR CIRCUIT OF SEMICONDUCTOR DEVICE

CROSS REFERENCE TO RELATED APPLICATIONS

This application is a Continuation-In-Part of pending U.S. patent application Ser. No. 13/867,122, filed on Apr. 21, 2013 and entitled "Through silicon via repair circuit of semiconductor apparatus", which claims priority of Taiwan Patent Application No. 101144576, filed on Nov. 28, 2012, the entirety of which is incorporated by reference herein.

This application claims priority of Taiwan Patent Application No. 102142945, filed on Nov. 26, 2013, the entirety of which is incorporated by reference herein.

BACKGROUND

1. Technical Field

The disclosure relates to a through silicon via (TSV) repair circuit of a semiconductor device applied to chip stacking technologies.

2. Description of the Related Art

As the semiconductor process technologies have developed, areas of integrated circuits (ICs) have been reduced and the number of transistors in a single IC has been increased, thereby leading to an increase in IC usage area and severe delay time and power consumption of signals. In order to solve problems such as severe delay time and power consumption, a three-dimensional IC (3-D IC) stacking technology is considered to be an effective solution and has been vigorously researched in recent years. In the 3-D IC stacking technology, a plurality of chips or dies are stacked vertically in a three-dimensional space to achieve the benefit of reduced sizes. A through silicon via (TSV) structure passing through substrates is used to transmit signals between different chips, and thus the interconnection length of transistors and delay time in a 3-D IC are much shorter than those in a transitional two-dimensional IC while the 3-D IC performance is increased and the 3-D IC power consumption is reduced at the same time.

Since layers of integrated circuits have to be stacked precisely when chips are stacked, a small stacking offset could result in TSV connection failure among the chips. In addition, in order to utilize areas of the chips effectively, the TSV size is the smaller the better. Nevertheless, in the TSV manufacturing process, a sidewall insulation layer (for example, $SiO_2$) is easily to be damaged or intruded by external impurity when being manufactured, resulting in a short circuit between the TSV and the substrate. Moreover, during the stack package process, an open defect may occur when TSVs in layers are being connected to each other. Therefore, a double TSV pair comprising of two TSVs is usually used to transmit signals in a 3-D IC. If one TSV of the double TSV pair has a defect, the other TSV of the double TSV pair can be used to transmit signals, thereby repairing the defective TSV. However, in this case, a leakage current will flow to the substrate via the defective TSV, thereby causing drift and instability of the global substrate voltage level and signal transmission failure.

In view of this, how to self-detect defects of TSVs and repair transmitting signals is an important issue in 3-D ICs.

SUMMARY

An embodiment of the disclosure provides a through silicon repair circuit of a semiconductor device, comprising: a first chip and a second chip, one of which stacks on the other; at least two data path circuits, configured in the first chip, each of which is coupled to a corresponding one of the at least two through silicon vias, wherein each of the at least two data path circuits comprises: an input driving circuit, converting a signal input from a first signal input terminal based on a power voltage and a ground voltage and transmitting the signal to a first end of the corresponding one of the at least two through silicon vias; a through silicon via detection circuit, coupled to the first signal input terminal and the first end of the corresponding one of the at least two through silicon vias, detecting a through silicon via status of the corresponding one of the at least two through silicon vias; a memory device, receiving and keeping the through silicon via status from the through silicon via detection circuit, wherein a control terminal of the memory device is coupled to a second signal input terminal; a protection circuit, coupled to the memory device and the first end of the corresponding one of the at least two through silicon vias, determining whether or not to pull the first end of the corresponding one of the at least two through silicon vias to the ground voltage based on the through silicon via status kept by the memory device; and a power control circuit, coupled to an between the power voltage and the input driving circuit and coupled to the memory device, providing the power voltage to the input driving circuit; and an output logic circuit, configured in the second chip, generating an output signal according to signals from at least two input terminals of the output logic circuit, wherein the at least two input terminals of the output logic circuit are coupled to second ends of the at least two through silicon vias, respectively.

Another embodiment of the disclosure provides a through silicon repair circuit of a semiconductor device, comprising: a plurality of chips, stacking in a single package, wherein each chip comprises at least two through silicon vias passing through a substrate of each chip, each of the at least two through silicon vias of each chip is directly or indirectly coupled to a corresponding through silicon via of an adjacent chip, at least one first chip of the plurality of chips comprises at least two data path circuits, at least one second chip of the plurality of chips comprises an output logic circuit, each of the at least two data path circuits of the at least one first chip is coupled to a corresponding one of the at least two through silicon vias of the at least one first chip, and each data path circuit comprises: an input driving circuit, converting a signal input from a first signal input terminal based on a power voltage and a ground voltage and transmitting the signal to a first end of the corresponding one of the at least two through silicon vias of the at least one first chip; a through silicon via detection circuit, coupled to the first signal input terminal and the first end of the corresponding one of the at least two through silicon vias of the at least one first chip, detecting a through silicon via status of the corresponding one of the at least two through silicon vias of the at least one first chip; a memory device, receiving and keeping the through silicon via status from the through silicon via detection circuit, wherein a control terminal of the memory device is coupled to a second signal input terminal; a protection circuit, coupled to the memory device and the first end of the corresponding one of the at least two through silicon vias of the at least one first chip, determining whether or not to pull the first end of the corresponding one of the at least two through silicon vias of the at least one first chip to the ground voltage based on the through silicon via status kept by the memory device; and a power control circuit, coupled to an between the power voltage and the input driving circuit and coupled to the memory device, providing the power voltage to the input driving circuit, wherein at least two input terminals of the output logic circuit of the at least one second chip are coupled to second ends of at the at least two through silicon vias of a chip which is stacked on the at least one second chip, respectively, and the output logic circuit of the at least one second chip generates an output signal according to signals from the at least two input terminals of the output logic circuit of the at least one second chip.

Another embodiment of the disclosure provides a through silicon repair circuit of a semiconductor device, comprising: a plurality of chips, stacking in a single package, wherein each chip comprises at least two through silicon vias passing through a substrate of each chip, at least one first chip of the plurality of chips comprises at least two data path circuits, at least one second chip of the plurality of chips comprises an output logic circuit and at least two data path circuit, each of the at least two data path circuits of the at least one first chip is coupled to a corresponding one of the at least two through silicon vias of the at least one first chip, each of the at least two data path circuits of the at least one second chip is coupled to a corresponding one of the at least two through silicon vias of the at least one second chip, and each data path circuit comprises: an input driving circuit, converting a signal input from a first signal input terminal based on a power voltage and a ground voltage and transmitting the signal to a first end of the corresponding one of the at least two through silicon vias; a through silicon via detection circuit, coupled to the first signal input terminal and the first end of the corresponding one of the at least two through silicon vias, detecting a through silicon via status of the corresponding one of the at least two through silicon vias; a memory device, receiving and keeping the through silicon via status from the through silicon via detection circuit, wherein a control terminal of the memory device is coupled to a second signal input terminal; a protection circuit, coupled to the memory device and the first end of the corresponding one of the at least two through silicon vias, determining whether or not to pull the first end of the corresponding one of the at least two through silicon vias to the ground voltage; and a power control circuit, coupled to an between the power voltage and the input driving circuit and coupled to the memory device, providing the power voltage to the input driving circuit, wherein at least two input terminals of the output logic circuit of the at least one second chip are coupled to second ends of the at least two through silicon vias of a chip which is stacked on the at least one second chip, respectively, the output logic circuit of the at least one second chip generates an output signal according to signals from the at least two input terminals of the output logic circuit of the at least one second chip, and the output signal of the output logic circuit of the at least one second chip is coupled to the first signal input terminals of the at least two data path circuits of the at least one second chip.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DESCRIPTION OF DISCLOSED EMBODIMENTS

Figure 1:
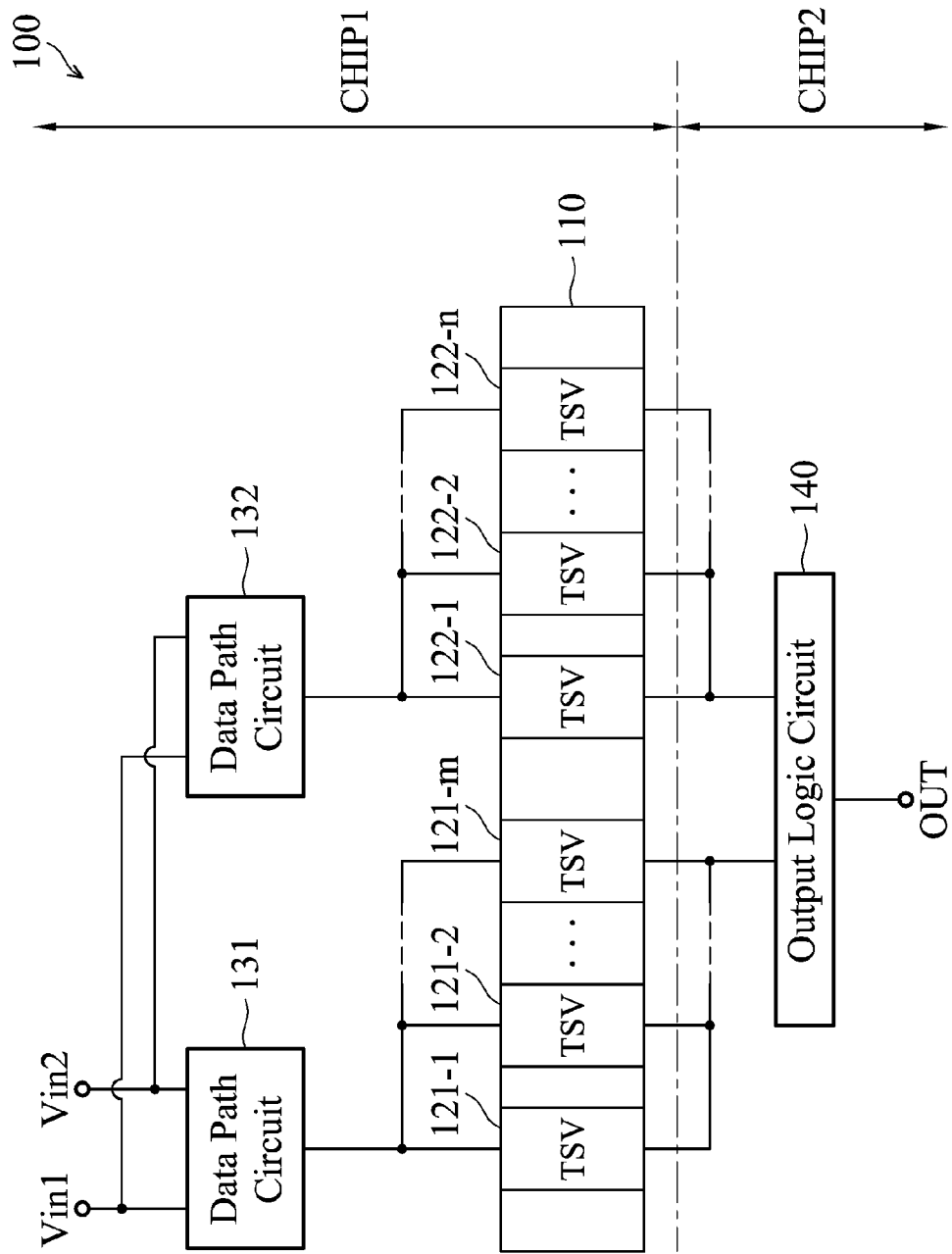
FIG. 1 is a block diagram of a through silicon via repair circuit of a semiconductor device according to an embodiment of the disclosure.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a block diagram of a through silicon via repair circuit 100 of a semiconductor device (such as a 3-D IC) according to an embodiment of the disclosure. The through silicon via repair circuit 100 comprises two chips CHIP1 and CHIP2 that are stacked. The chip CHIP1 comprises a substrate 110, m through silicon vias 121-1~121-m, n through silicon vias 122-1~122-n, data path circuits 131 and 132 and signal terminals Vin1 and Vin2. The data path circuit 131 is coupled to the through silicon vias 121-1~121-m, and the data path circuit 132 is coupled to the through silicon vias 122-1~122-n. The through silicon vias 121-1~121-m and 122-1~122-n pass through the substrate 110 so as to transmit signals from the chip CHIP1 to the chip CHIP2. In the disclosure, m and n are positive integers. The chip CHIP2 comprises an output logic circuit 140 and an output signal terminal OUT. The output logic circuit 140 is coupled to the through silicon vias 121-1~121-m and 122-1~122-n. For clarity and brevity, some parts of the interior configuration of the chip CHIP2 are omitted.

As shown in FIG. 1, there are mainly two data paths in the embodiment. The first data path corresponds to the data path circuit 131 and the through silicon vias 121-1~121-m, and the second data path corresponds to the data path circuit 132 and the through silicon vias 122-1~122-n. The two data paths receive input signals from the signal terminal Vin1 and transmit the input signals to the chip CHIP2 via at least one of the through silicon vias 121-1~121-m and 122-1~122-n. The output logic circuit of the chip CHIP2 receives signals transmitted from the through silicon vias 121-1~121-m and 122-1~122-n and outputs signals to the output signal terminal OUT. It is noted that the disclosure is not limited to two data paths. A skilled person in the art may apply the embodiment to three or more data paths.

To be noted, though the embodiment in FIG. 1 illustrates two chips CHIP1 and CHIP 2, one of which stacks on the other, the disclosure is not limited thereto. For example, the embodiment may be further applied to a 3-D IC comprising of at least three chips stacking. Any two chips for transmitting signals to each other in the 3-D IC described above can be the chips CHIP1 and CHIP2, and there may be at least one another chip between the chips CHIP1 and CHIP2. Alternatively, the 3-D IC described above may comprise one chip CHIP1 and at least two chips CHIP2. Moreover, in an example where there is at least one another chip between the chips CHIP1 and CHIP2, the through silicon vias in the two data path pass through substrates of multiple chips so as to transmit signals to the chip CHIP2.

Figure 2:
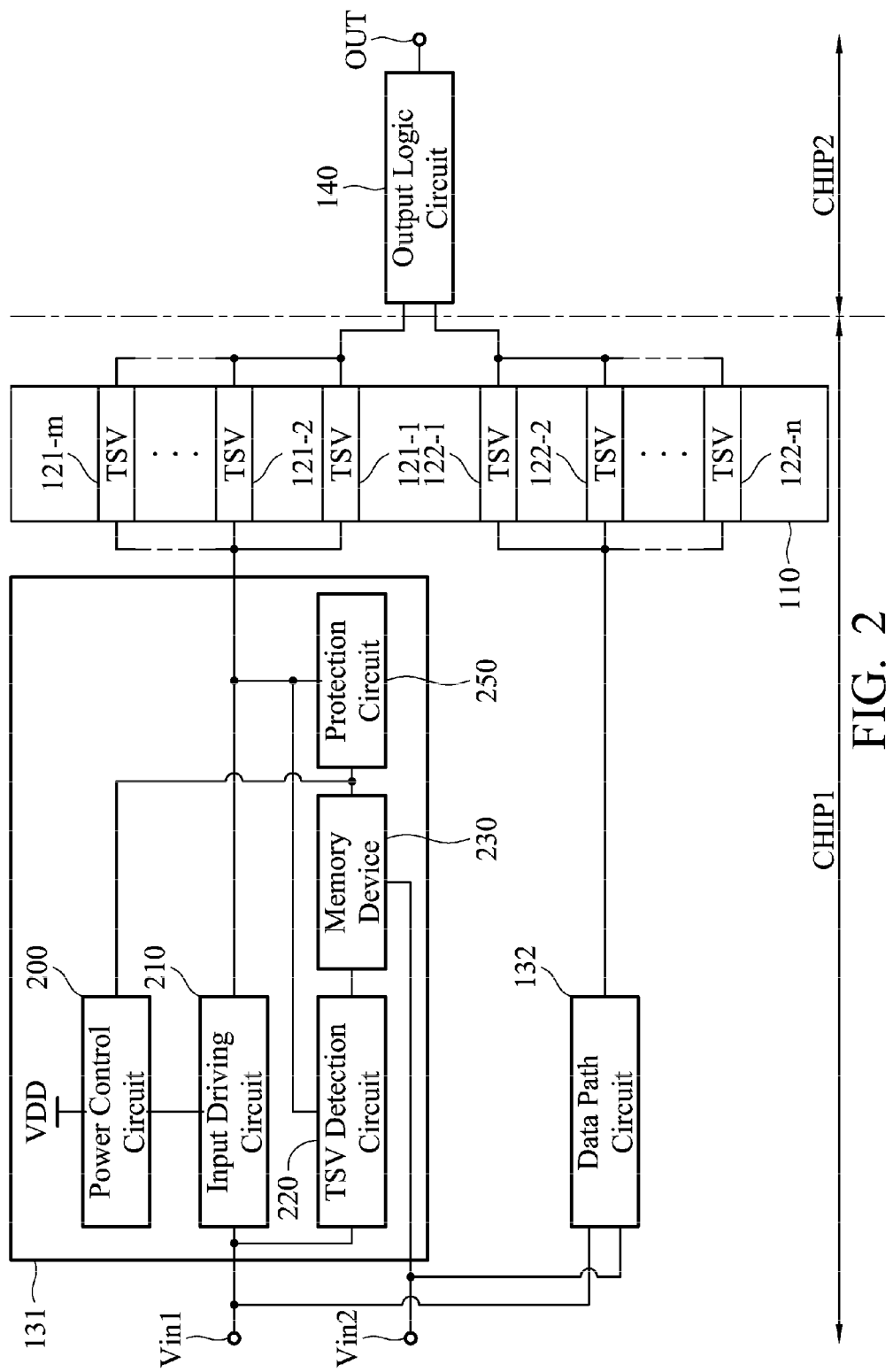
FIG. 2 is an exemplary detailed block diagram of the through silicon via repair circuit in FIG. 1.

FIG. 2 is an exemplary detailed block diagram of the through silicon via repair circuit 100 in FIG. 1. As shown in FIG. 2, the data path circuit 131 comprises a power control circuit 200, an input driving circuit 210, a TSV detection circuit 220, a memory device 230 and a protection circuit 250. The power control circuit 200 is coupled to a power voltage VDD and provides the power voltage VDD to the input driving circuit 210. The input driving circuit 210 is coupled to the signal terminal Vin1 and first ends of the through silicon vias 121-1~121-m. The input driving circuit 210 converts a signal input from the signal terminal Vin1 based on the power voltage VDD and a ground voltage and transmits the converted signal to the first ends of the through silicon vias 121-1~121-m. The TSV detection circuit 220 is coupled to the signal terminal Vin1, the first ends of the through silicon vias 121-1~121-m and pass signals to the memory device 230. The TSV detection circuit 220 detects a TSV status of the through silicon vias 121-1~121-m based on a detection driving signal input from the signal terminal Vin1 and transmits the detected TSV status to the memory device 230. An output terminal of the memory device 230 is coupled to the power control circuit 200 and the protection circuit 250, an input terminal of the memory device 230 is coupled to an output terminal of the TSV detection circuit 220, and a control terminal of the memory device 230 is coupled to the signal terminal Vin2. The memory device 230 is activated to receive and keep the TSV status according to a control voltage at the signal terminal Vin2. The protection circuit 250 is coupled to the first terminal of the through silicon vias 121-1~121-m and determines whether or not to pull the first ends of the through silicon vias 121-1~121-m to the ground voltage based on the TSV status kept by the memory device 230. The power control circuit 200 determines whether or not to stop providing the power voltage VDD to the input driving circuit 210 based on the TSV status kept by the memory device 230. The internal configuration of the data path circuit 132 is the same as the data path circuit 131 and thus is not shown in FIG. 2 for clarity and brevity.

The operation of the through silicon via repair circuit 100 comprises two parts: a self-detection process for detecting TSV status and a data transmission process after the self-detection process for transmitting data from the chip CHIP1 to the chip CHIP2. During the self-detection process of the through silicon via repair circuit 100, first, the input driving circuit 210 and the TSV detection circuit 220 receive the detection driving signal from the signal terminal Vin1 and the memory device 230 receives a memory trigger signal from the signal terminal Vin2 to keep the TSV status. The input driving circuit 210 converts the detection driving signal based on the power voltage VDD and the ground voltage and then transmits the converted detection driving signal to the first ends of the through silicon vias 121-1~121-m to drive the through silicon vias 121-1~121-m. The TSV detection circuit 220 detects the TSV status of the through silicon vias 121-1~121-m based on the detection driving signal, and the memory device 230 which has already been triggered by the memory trigger signal keeps the detected TSV status.

According to the detection result of the TSV detection circuit 220, if all through silicon vias of the through silicon vias 121-1~121-m have no defect, which means the TSV status of the first data path is normal (data can be normally transmitted via the first data path), then the TSV status kept by the memory device 230 is normal. In this case, the power control circuit 200 keeps providing the power voltage VDD to the input driving circuit 210 based on the normal TSV status kept by the memory device 230, and the protection circuit 250 will not pull the first ends of the through silicon vias 121-1~121-m to the ground voltage based on the normal TSV status kept by the memory device 230. According to the detection result of the TSV detection circuit 220, if at least one through silicon via of the through silicon vias 121-1~121-m has a defect, which means the TSV status of the first data path is abnormal/defective (data cannot be normally transmitted via the first data path), then the TSV status kept by the memory device 230 is abnormal/defective. In this case, the power control circuit 200 stops providing the power voltage VDD to the input driving circuit 210 based on the abnormal/defective TSV status kept by the memory device 230, and the protection circuit 250 pulls the first ends of the through silicon vias 121-1~121-m to the ground voltage based on the abnormal/defective TSV status kept by the memory device 230.

Figure 3:
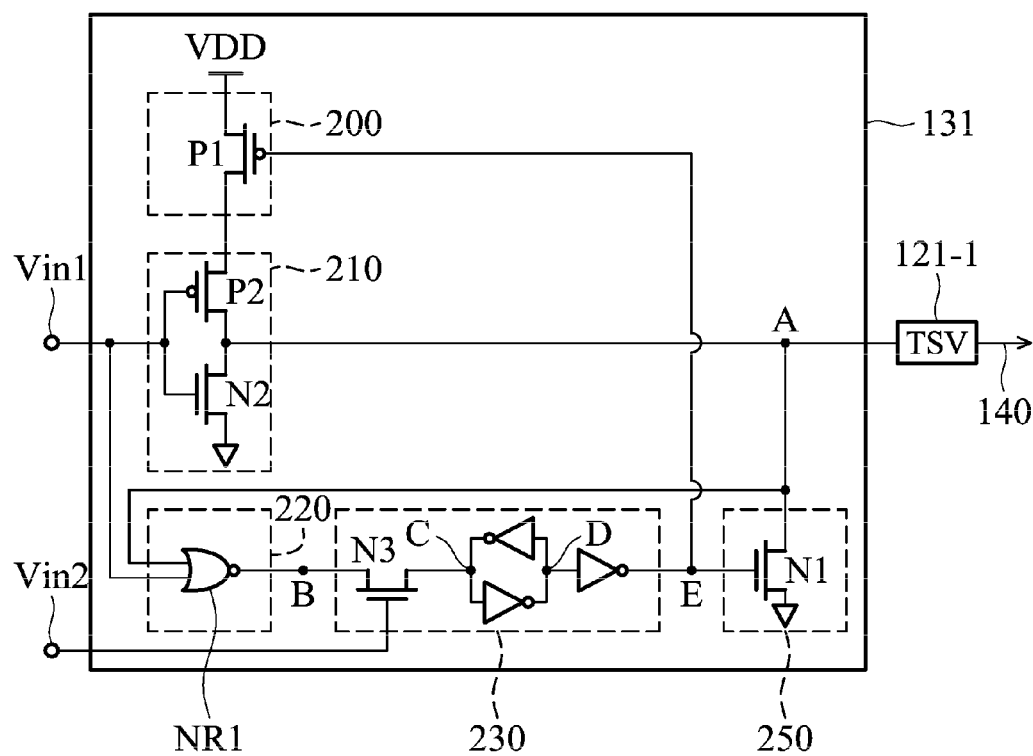
FIG. 3 is an exemplary circuit diagram of the data path circuit in FIG. 1.

FIG. 3 is an exemplary circuit diagram of the data path circuit 131 in FIG. 1. It is noted that, for clarity and brevity, the through silicon via 121-1 is illustrated in FIG. 3 and that the other through silicon vias are omitted. The power control circuit 200 comprises a P-type Metal-Oxide-Semiconductor (PMOS) transistor P1. The input driving circuit 210 comprises an inverter including a PMOS transistor P2 and an N-type Metal-Oxide-Semiconductor (NMOS) transistor N2. The TSV detection circuit 220 comprises a NOR gate NR1. The memory device 230 comprises an NMOS transistor N3, a keeper including two inverters connected to each other and an inversion buffer. The protection circuit 250 comprises an NMOS transistor N1. The source terminal of the PMOS transistor P1 is coupled to the power voltage VDD, the drain terminal of the PMOS transistor P1 is coupled to the source terminal of the PMOS transistor P2, and the gate terminal of the PMOS transistor P1 is coupled to the output terminal of the memory device 230 and the gate terminal od the NMOS transistor N1. The gate terminal of the PMOS transistor P2 and the gate terminal of the NMOS transistor N2 are coupled to the signal terminal Vin1, the source terminal of the PMOS transistor P2 is coupled to the drain terminal of the PMOS transistor P1, the source terminal of the NMOS transistor N2 is coupled to the ground voltage, and the drain terminal of the PMOS transistor P2 and the drain terminal of the NMOS transistor N2 are coupled to the first end of the through silicon via 121-1. The first input terminal of the NOR gate NR1 is coupled to the first end of the first end of the through silicon via 121-1, the second input terminal of the NOR gate NR1 is coupled to the signal terminal Vin1, and the output terminal of the NOR gate NR1 is coupled to the drain terminal of the NMOS transistor N3. The source terminal of the NMOS transistor N3 is coupled to the input terminal of the keeper, and the gate terminal of the NMOS transistor N3 is coupled to the signal terminal Vin2. The output terminal of the keeper is coupled to the input terminal of the inversion buffer. The output terminal of the inversion buffer is coupled to the gate terminal of the PMOS transistor P1 and the gate terminal of the NMOS transistor N1. The drain terminal of the NMOS transistor N1 is coupled to the first end of the through silicon via 121-1, and the source terminal of the NMOS transistor N1 is coupled to the ground voltage.

The self-detection process of the through silicon via repair circuit 100 will be described with reference to FIG. 3 in the following. During the self-detection process, first, the detection driving signal of logic "0" is input to the signal terminal Vin1 and the memory trigger signal of logic "1" is input to the signal terminal Vin2. Then, in a case where the through silicon via 121-1 is normal: the inverter of the input driving circuit 210 converts the detection driving signal of logic "0" into a signal of logic "1" and transmits the signal of logic "1" to the first end of the through silicon via 121-1, that is, the node A; the NOR gate NR1 of the TSV detection circuit 220 receives the logic "1" from the node A and the logic "0" from the signal terminal Vin1 and thus outputs a logic "0" to the memory device 230; since the memory device 230 has been triggered by the memory trigger signal of logic "1" input from the signal terminal Vin2, the memory device 230 is able to record and keep the logic "0" output from the NOR gate NR1; the memory device 230 outputs the logic "0" to the gate terminal of the NMOS transistor N1 of the protection circuit 250 to turn off the NMOS transistor N1; and the memory device 230 outputs the logic "0" to the gate terminal of the PMOS transistor P1 of the power control circuit 200 to keep the PMOS transistor P1 on.

In a case where the through silicon via 121-1 has a defect (for example, a short circuit defect): the inverter of the input driving circuit 210 converts the detection driving signal of logic "0" into a signal of logic "1" and transmits the signal of logic "1" to the first end of the through silicon via 121-1, that is, the node A; since the through silicon via 121-1 has the defect, the signal at the node A is pulled to logic "0"; the NOR gate NR1 of the TSV detection circuit 220 receives the logic "0" from the node A and the logic "0" from the signal terminal Vin1 and thus outputs a logic "1" to the memory device 230; since the memory device 230 has been triggered by the memory trigger signal of logic "1" input from the signal terminal Vin2, the memory device 230 is able to record and keep the logic "1" output from the NOR gate NR1; the memory device 230 outputs the logic "1" to the gate terminal of the NMOS transistor N1 of the protection circuit 250 to turn on the NMOS transistor N1, that is, turn on the protection circuit 250; the node A is pulled to the ground voltage by the turned-on NMOS transistor N1; and the memory device 230 also outputs the logic "1" to the gate terminal of the PMOS transistor P1 of the power control circuit 200 to turn off the PMOS transistor P1 so as to prevent a leakage current of the power voltage VDD from flowing to the substrate. After the self-detection process, the signal at the signal terminal Vin2 is changed to logic "0" to prevent the memory device 230 from being re-triggered, and thus the memory device 230 will keep holding the TSV status obtained in the self-detection process. During the self-detection process, the operation of the data path circuit 132 is the same as that of the data path circuit 132 and will not be described again here. It is noted that the self-detection process has to be performed before the data transmission process so as to make the memory device of each data path record the TSV status of each data path. Furthermore, the memory device in the disclosure can be carried out by a latch, a D-type flip-flop or a non-volatile memory and is not limited to the configuration as shown in the figure.

Figure 4:
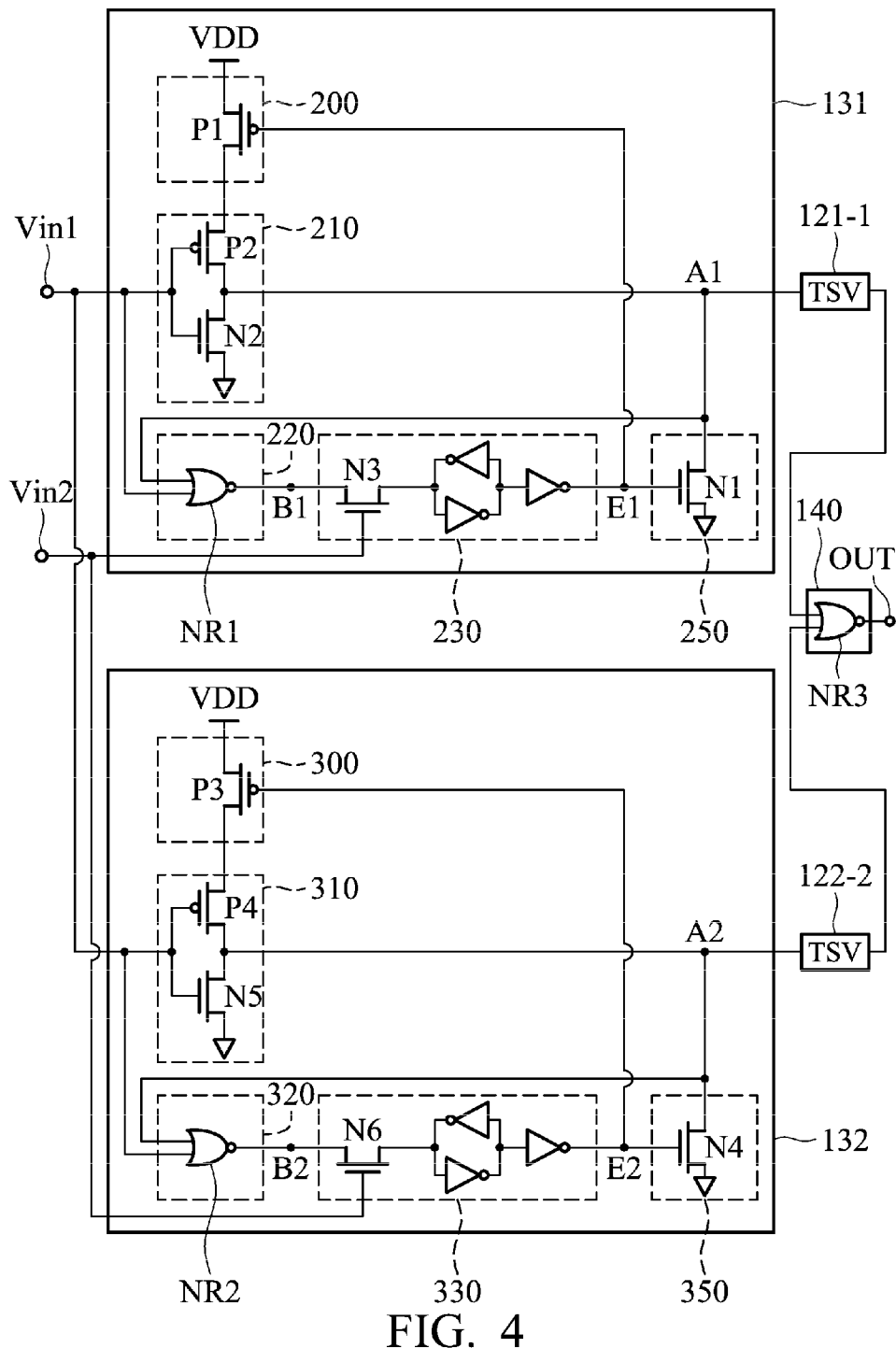
FIG. 4 is an exemplary circuit diagram of the through silicon via repair circuit in FIG. 1.

FIG. 4 is an exemplary circuit diagram of the through silicon via repair circuit 100 in FIG. 1. In FIG. 4, configurations of the data path circuit 131 and the data path circuit 132 are the same as those in FIG. 3 and will not be described again here. The output logic circuit 140 comprises an NOR gate NR3. The data transmission process of the through silicon via repair circuit 100 after the self-detection process will be described with reference to FIG. 4 in the following. Table 1 is a truth table of signals at nodes of the through silicon repair circuit in the data transmission process in a case where the memory devices 230 and 330 have already stored the TSV statuses of the TSVs 121-1 and 122-2, respectively. During the data transmission process, the signal terminal Vin2 is always at logic "0". Table 2 illustrates turning-on or off of the elements in the data transmission process after the self-detection process of the through silicon via repair circuit 100.

TABLE 1

| TSV1 status | TSV2 status | Vin1 | A1 | A2 | B1 | B2 | E1 | E2 | OUT |
|---|---|---|---|---|---|---|---|---|---|
| N | N | 1 | 0 | 0 | 0 | 0 | 0 | 0 | 1 |
| N | N | 0 | 1 | 1 | 0 | 0 | 0 | 0 | 0 |
| D | N | 1 | 0 | 0 | 0 | 0 | 1 | 0 | 1 |
| D | N | 0 | 0 | 1 | 1 | 0 | 1 | 0 | 0 |
| N | D | 1 | 0 | 0 | 0 | 0 | 0 | 1 | 1 |
| N | D | 0 | 1 | 0 | 0 | 1 | 0 | 1 | 0 |
| D | D | 1 | 0 | 0 | 0 | 0 | 1 | 1 | 1 |
| D | D | 0 | 0 | 0 | 0 | 0 | 1 | 1 | 1 |

TABLE 2

| TSV1 status | TSV2 status | N1 | N4 | P1 | P3 |
|---|---|---|---|---|---|
| N | N | off | off | on | on |
| D | N | on | off | off | on |
| N | D | off | on | on | off |
| D | D | on | on | off | off |

In Table 1 and Table 2, "TSV1 status" indicates the TSV status of the first data path, that is, the TSV status of the through silicon via 121-1 in FIG. 4, "TSV2 status" indicates the TSV status of the second data path, that is, the TSV status of the through silicon via 122-2 in FIG. 4, "N" denotes the normal TSV status, and "D" denotes the defective TSV status. In an example where the TSV1 status is defective and the TSV2 status is normal, when a logic "0" is input to the signal terminal Vin1, since the memory device 230 has kept the logic "1" indicating that the TSV1 status is defective and the memory device has kept the logic "0" indicating that the TSV2 status is normal, the nodes E1 and E2 are at logic "1" and "0", respectively. Therefore, the NMOS transistor N1 is turned on, pulling the node A1 to logic "0", and the PMOS transistor P1 is turned off, preventing the VDD leakage current from flowing from the defective through silicon via 121-1 to the substrate. In addition, because the PMOS transistor P1 is turned off, about half of the power consumption can be saved. Meanwhile, the NMOS transistor N4 is turned off and the PMOS transistor P3 is turned on, thereby making the second data path transmit data normally. The first input signal which the NOR gate NR3 of the output logic circuit 140 receives from the first data path is at logic "0", and the second input signal which the NOR gate NR3 of the output logic circuit 140 receives from the second data path is at logic "1", and thus the output terminal OUT of the output logic circuit 140 will output a logic "0", which means the logic "0" at the signal terminal Vin1 is output correctly. Accordingly, the effect of repairing signals transmitted through TSVs can be achieved.

Figure 5:
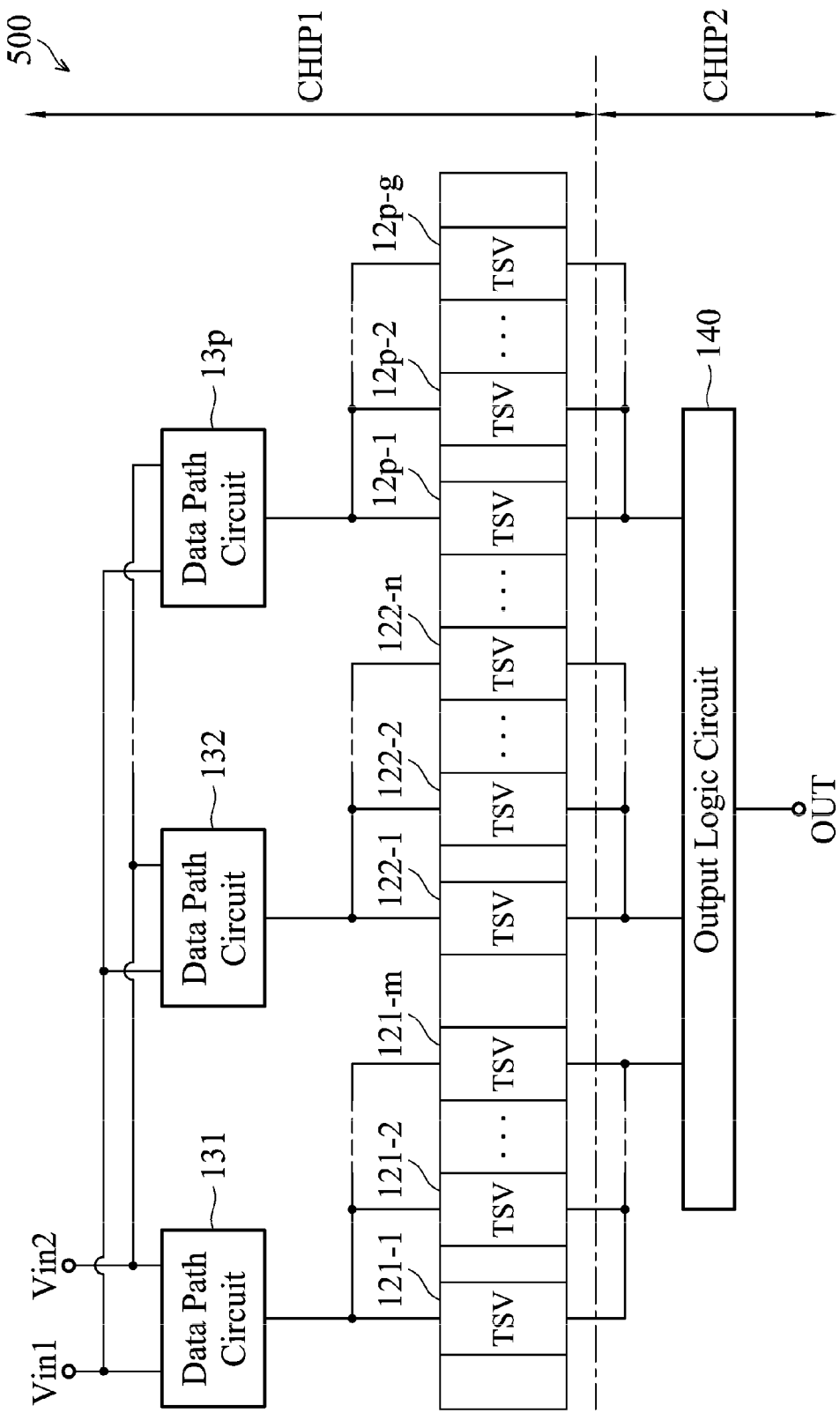
FIG. 5 is a block diagram of a through silicon via repair circuit of a semiconductor device according to an embodiment of the disclosure.

As shown in Table 1, the signal at the output terminal OUT is consistent with the signal at the signal terminal Vin1, that is, the TSV signal transmission is correct, except the case where the TSV1 status and the TSV2 status are both defective and a logic "0" is input to the signal terminal Vin1. However, in a case where the TSV1 status and the TSV2 status are both defective, at least one another data path, for example, a third data path as shown in FIG. 5, can be added into the through silicon via repair circuit to repair the signals transmitted through TSVs. FIG. 5 is a block diagram of a through silicon via repair circuit 500 of a semiconductor device according to an embodiment of the disclosure. The through silicon via repair circuit 500 is similar to the through silicon via repair circuit 100, and the main difference is that the through silicon via repair circuit 500 has three data paths. It is noted that the through silicon via repair circuit in the disclosure may comprise more than three data paths. Therefore, as long as the TSV status of one of the data paths is normal, the output logic circuit coupled to all data paths can repair the signals to output the correct signals.

The through silicon via repair circuit in the disclosure has a wide application in the 3-D IC technology. In a plurality of chips in a 3-D IC, at least two through silicon vias are configured in a substrate of each chip, and each of the at least two through silicon vias of each chip is directly or indirectly coupled to a corresponding through silicon via of at least two through silicon vias of an adjacent chip. For example, as show in FIG. 6, the through silicon via 221 of the chip CHIP2 is coupled to the through silicon via 121 of the chip CHIP1 and the through silicon via 321 of the chip CHIP3. Any one of the plurality of chips can be configured with at least two data path circuits, and any one of the plurality of chips can be configured with an output logic circuit. The situation where a through silicon via repair circuit is applied to multiple layers of chips stacked in a single package will be explained with reference to FIG. 6 and FIG. 7 in the following. It is noted that some operations in FIG. 6 and FIG. 7 are similar to those described above and will not be described again here.

Figure 6:
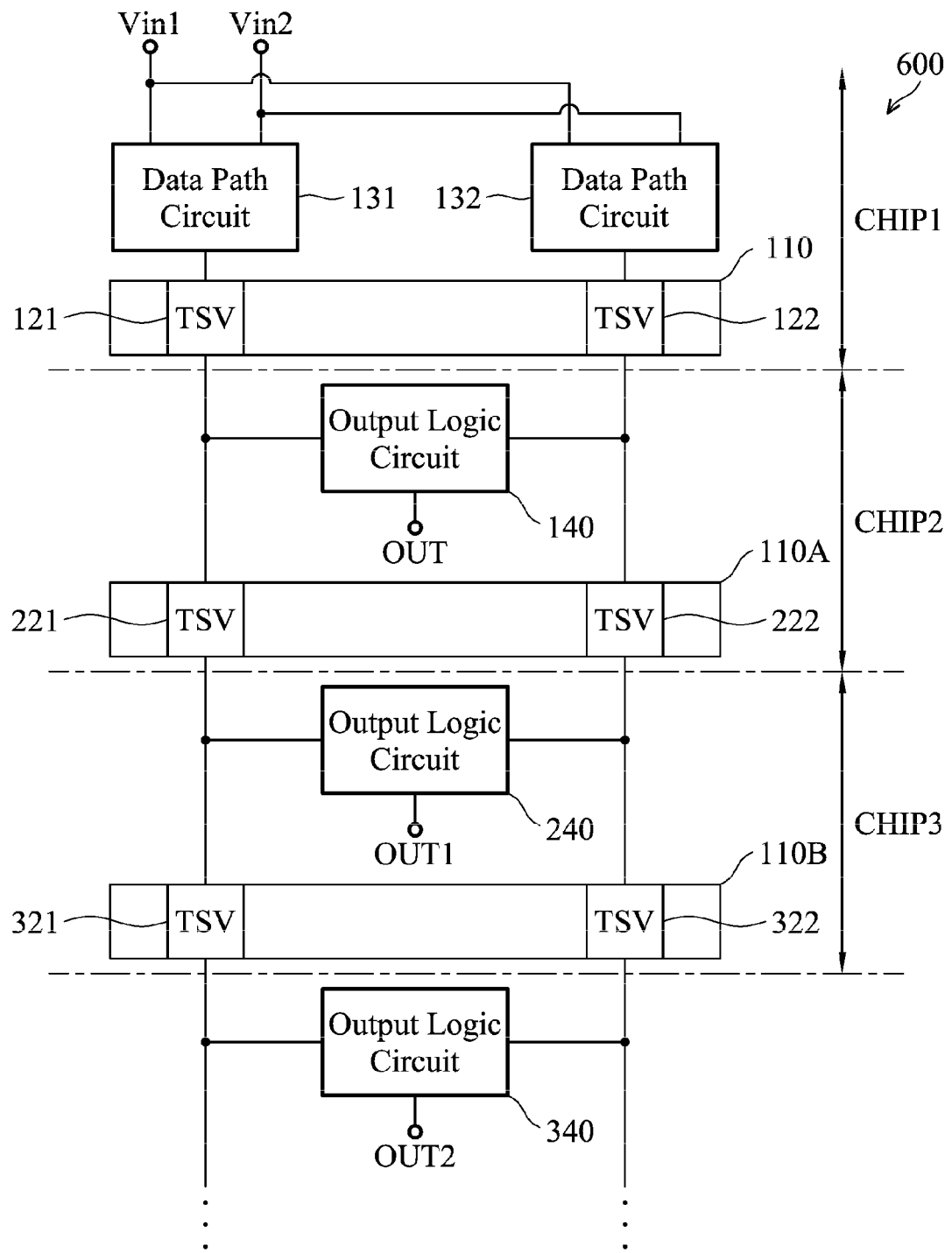
FIG. 6 is a block diagram of a through silicon via repair circuit of a semiconductor device according to an embodiment of the disclosure.

FIG. 6 is a block diagram of a through silicon via repair circuit 600 of a semiconductor device according to an embodiment of the disclosure. The through silicon via repair circuit 600 comprises a plurality of chips, such as chips CHIP1, CHIP2, CHIP3 and so on. The plurality of chips is vertically stacked in a single package. In FIG. 6, the data path circuits 131 and 132 of the through silicon via repair circuit 600 are configured in the top chip CHIP1, but the disclosure is not limited thereto. For example, data path circuits can also be configured in other chip(s). In FIG. 6, the output logic circuit 140 is configured in the chip CHIP2, but the disclosure is not limited thereto. For example, another output logic circuit(s) can be configured in chip(s) other than the chip CHIP2, such as the chip CHIP3. The output logic circuits 140, 240, 340 in different chips generate output signals OUT, OUT1, OUT2, and thus the input signal input from the signal terminal Vin1 can be correctly transmitted to each chip. In the embodiment as shown in FIG. 6, the data path circuit 131 detects the TSV status of the through silicon vias 121, 221 and 321 connected in serial during the self-detection process. In the embodiment as shown in FIG. 6, though the data path circuits 131 and 132 are configured in the chip CHIP1, it is possible that a short circuit between a through silicon via and a corresponding substrate occurs in any chip. Therefore, the data path circuits 131 and 132 can detect, for example, the short circuit between any through silicon via and the substrate 110A occurring in the chip CHIP2 and perform the repair so as to prevent the leakage current of the power voltage from flowing through the substrate 110A of the chip CHIP2.

Figure 7:
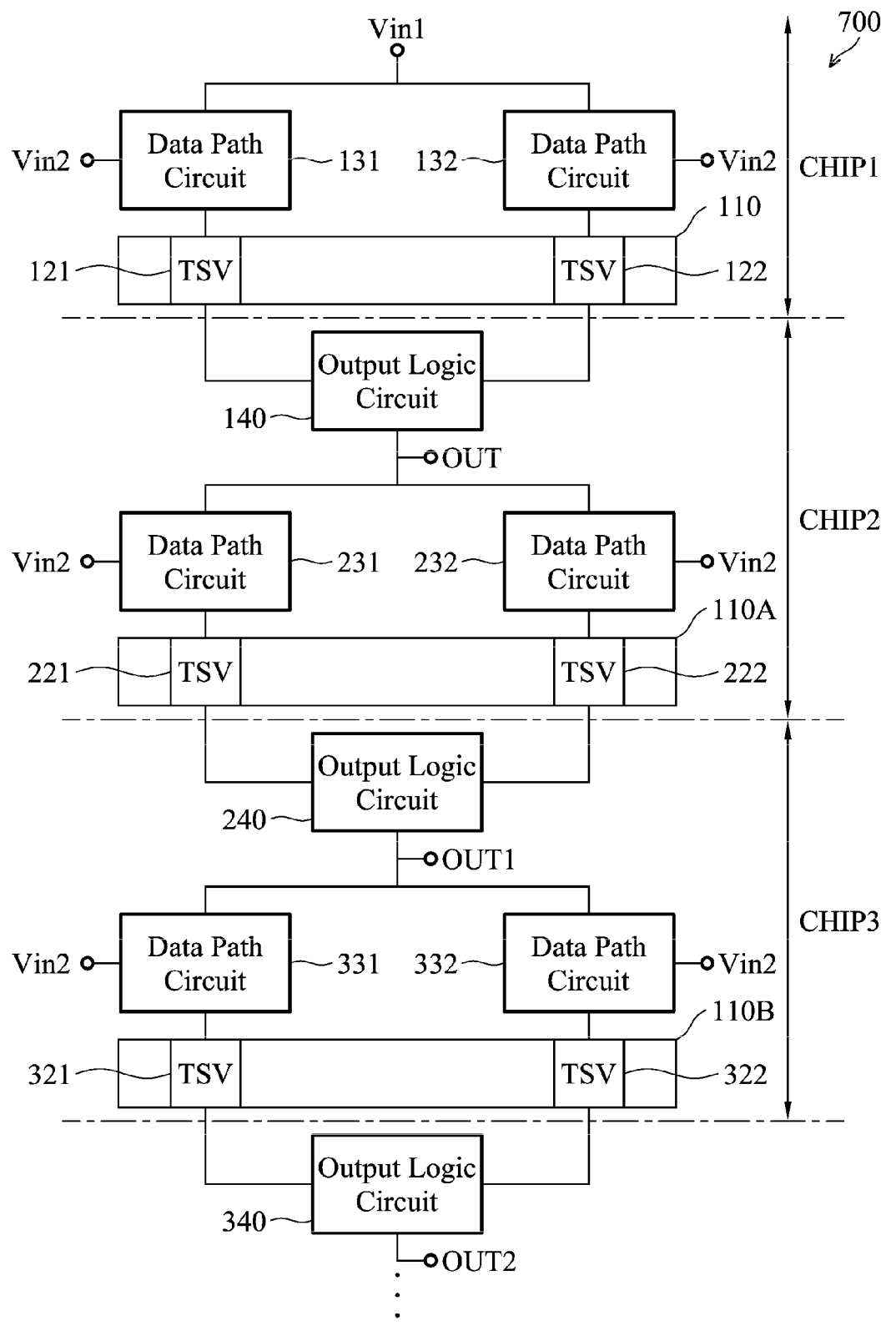
FIG. 7 is a block diagram of a through silicon via repair circuit of a semiconductor device according to an embodiment of the disclosure.

FIG. 7 is a block diagram of a through silicon via repair circuit 700 of a semiconductor device according to an embodiment of the disclosure. As shown in the through silicon via repair circuit 700, data path circuits are not limited to be configured in a single chip, data path circuits can be configured in any other chip, and output logic circuits in chips are used to transmit repaired signals to another chip. Therefore, according to the through silicon via repair circuit 700 in FIG. 7, if the two data paths configured in the same chip don't have defects simultaneously, signals can be correctly transmitted to another chip. For example, if the TSV statuses of the through silicon vias 121, 222 and 321 are normal and the TSV statuses of the through silicon vias 122, 221 and 322 are defective, the signal at the signal terminal Vin1 can be correctly transmitted to the output terminal OUT2. If the two data paths configured in the same chip have defects simultaneously, a third data path or a plurality of data paths can be added into the through silicon via repair circuit 700 to avoid data transmission error.

An embodiment of the disclosure provides a through silicon repair circuit of a semiconductor device. The through silicon repair circuit comprises a plurality of chips, stacking in a single package. Each chip comprises at least two through silicon vias passing through a substrate of each chip. The plurality of chips may comprise at least one first chip (such as the chip CHIP1 in FIG. 6 and the chip CHIP1 in FIG. 7), and the at least one first chip comprises at least two data path circuits. An output terminal of each data path circuit is coupled to a first end of a corresponding through silicon via. A first signal input terminal of each data path circuit receives to-be-transmitted signals from the upper chip (the chip stacked on the at least one first chip) or the outside. A second signal input terminal of each data path circuit receives a trigger control signal for a memory device of the data path circuit. The plurality of chips may comprise at least one second chip (such as the chips CHIP2 and CHIP3 in FIG. 6), and the at least one second chip comprises an output logic circuit. The output logic circuit comprises at least two input terminals. Each input terminal is coupled to a second end of a corresponding through silicon via of the upper chip, that is, a first end of each through silicon via of the at least one second chip is coupled to a second end of a corresponding through silicon via of the upper chip. The plurality of chips may comprise at least one third chip (such as the chips CHIP2 and CHIP3 in FIG. 7), and the at least one third chip comprises at least two data path circuits and an output logic circuit. An output terminal of each data path circuit is coupled to a first end of a corresponding through silicon via. A first signal input terminal of each data path circuit is coupled to an output terminal of the output logic circuit. A second signal input terminal of each data path circuit receives a trigger control signal for a memory device of the data path circuit. Each input terminal of the output logic circuit is coupled to a second end of a corresponding through silicon via in the upper chip. The plurality of chips may comprise chips having no data path circuit and no output logic circuit. A first end of each through silicon via of the chips is directly coupled to a second end of a corresponding through silicon via in the upper chip.

As described above, in the through silicon via repair circuit in the disclosure, at least two TSV data paths are used to transmit data, each TSV data path comprises a memory device for recording/keeping the TSV status of the TSV data path, and before the through silicon via repair circuit performs the data transmission process, the self-detection process is performed so as to detect the TSV status of each TSV data path and make the memory device of each TSV data path record/keep the TSV status. When the TSV status of any TSV data path is defective, the protection circuit of the TSV data path is turned on to pull the first end of the defective TSV to the ground voltage, and the power control circuit of the TSV data path is turned off to prevent the power leakage current from flowing to the substrate and save the power consumption of the TSV data path. Since the memory device can always keep the TSV status, which is normal or defective, after the self-detection process, the power control circuit of the TSV data path can be turned off continuously and the first end of the defective TSV can be pulled to the ground voltage continuously if the TSV status is defective. Meanwhile, the at least two TSV data paths are all coupled to the output logic circuit. The output logic circuit can transmit the repaired signals to the next chip.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A through silicon repair circuit of a semiconductor device, comprising:
    a first chip and a second chip, one of which stacks on the other;
    at least two through silicon vias, passing through a substrate of the first chip to transmit data between the first chip and the second chip;
    at least two data path circuits, configured in the first chip, each of which is coupled to a corresponding one of the at least two through silicon vias, wherein each of the at least two data path circuits comprises:
        an input driving circuit, converting a signal input from a first signal input terminal based on a power voltage and a ground voltage and transmitting the signal to a first end of the corresponding one of the at least two through silicon vias;
        a through silicon via detection circuit, coupled to the first signal input terminal and the first end of the corresponding one of the at least two through silicon vias, detecting a through silicon via status of the corresponding one of the at least two through silicon vias;
        a memory device, receiving and keeping the through silicon via status from the through silicon via detection circuit, wherein a control terminal of the memory device is coupled to a second signal input terminal;
        a protection circuit, coupled to the memory device and the first end of the corresponding one of the at least two through silicon vias, determining whether or not to pull the first end of the corresponding one of the at least two through silicon vias to the ground voltage based on the through silicon via status kept by the memory device; and
        a power control circuit, coupled to an between the power voltage and the input driving circuit and coupled to the memory device, providing the power voltage to the input driving circuit; and
    an output logic circuit, configured in the second chip, generating an output signal according to signals from at least two input terminals of the output logic circuit, wherein the at least two input terminals of the output logic circuit are coupled to second ends of the at least two through silicon vias, respectively.

2. The through silicon via repair circuit as claimed in claim 1, wherein before the through silicon via repair circuit performs data transmission, the first signal input terminal inputs a detection driving signal, the through silicon via detection circuit detects the through silicon via status based on the detection driving signal, and the second signal input terminal inputs a memory trigger signal to trigger the memory device to keep the through silicon via status.

3. The through silicon via repair circuit as claimed in claim 2, wherein if the through silicon via status is defective, the power control circuit stops providing the power voltage to the input driving circuit, and the protection circuit pulls the first end of the corresponding one of the at least two through silicon vias to the ground voltage.

4. The through silicon via repair circuit as claimed in claim 1, wherein the power control circuit comprises:
    a first switch, wherein a first terminal of the first switch is coupled to the power voltage, a second terminal of the first switch is coupled to a power terminal of the input driving circuit, and a control terminal of the first switch is coupled to an output terminal of the memory device.

5. The through silicon via repair circuit as claimed in claim 1, wherein the protection circuit comprises:
    a second switch, wherein a first terminal of the second switch is coupled to the first end of the corresponding one of the at least two through silicon vias, a second terminal of the second switch is coupled to the ground voltage, and a control terminal of the second switch is coupled to an output terminal of the memory device.

6. The through silicon via repair circuit as claimed in claim 1, wherein the input driving circuit comprises:
    an inverter, wherein an input terminal of the inverter is coupled to the first signal input terminal, and an output terminal of the inverter is coupled to the first end of the corresponding one of the at least two through silicon vias.

7. The through silicon via repair circuit as claimed in claim 1, wherein the through silicon via detection circuit comprises:
    a first NOR gate, wherein a first input terminal of the first NOR gate is coupled to the first end of the corresponding one of the at least two through silicon vias, a second input terminal of the first NOR gate is coupled to the first signal input terminal, and an output terminal of the first NOR gate is coupled to an input terminal of the memory device.

8. The through silicon via repair circuit as claimed in claim 1, wherein the output logic circuit comprises:
    a second NOR gate, wherein at least two input terminals of the second NOR gate are coupled to second ends of the at least two through silicon vias, respectively.

9. The through silicon via repair circuit as claimed in claim 1, wherein the memory device comprises:
    a keeper;
    a third switch, wherein a first terminal of the third switch is coupled to an output terminal of the through silicon via detection circuit, a second terminal of the third switch is coupled to an input terminal of the keeper, and a control terminal of the third switch is coupled to the second signal input terminal; and
    a buffer, wherein an input terminal of the buffer is coupled to an output terminal of the keeper, and an output terminal of the buffer is coupled to the protection circuit.

10. The through silicon via repair circuit as claimed in claim 1, wherein the memory device comprises a latch, a D-type flip-flop or a non-volatile memory.

11. The through silicon via repair circuit as claimed in claim 1, wherein the at least two through silicon vias comprise at least one first through silicon via and at least one second through silicon via, the at least two data path circuits comprise a first data path circuit and a second data path circuit, the first data path circuit is coupled to a first end of the at least one first through silicon via, and the second data path circuit is coupled to a first end of the at least one second through silicon via.

12. The through silicon via repair circuit as claimed in claim 1, wherein the at least two through silicon vias comprise at least one first through silicon via, at least one second through silicon via and at least one third through silicon via, the at least two data path circuits comprise a first data path circuit, a second data path circuit and a third data path circuit, the first data path circuit is coupled to a first end of the at least one first through silicon via, the second data path circuit is coupled to a first end of the at least one second through silicon via, and the third data path circuit is coupled to a first end of the at least one third through silicon via.

13. A through silicon repair circuit of a semiconductor device, comprising:
- a plurality of chips, stacking in a single package, wherein each chip comprises at least two through silicon vias passing through a substrate of each chip, each of the at least two through silicon vias of each chip is directly or indirectly coupled to a corresponding through silicon via of an adjacent chip, at least one first chip of the plurality of chips comprises at least two data path circuits, at least one second chip of the plurality of chips comprises an output logic circuit, each of the at least two data path circuits of the at least one first chip is coupled to a corresponding one of the at least two through silicon vias of the at least one first chip, and each data path circuit comprises:
  - an input driving circuit, converting a signal input from a first signal input terminal based on a power voltage and a ground voltage and transmitting the signal to a first end of the corresponding one of the at least two through silicon vias of the at least one first chip;
  - a through silicon via detection circuit, coupled to the first signal input terminal and the first end of the corresponding one of the at least two through silicon vias of the at least one first chip, detecting a through silicon via status of the corresponding one of the at least two through silicon vias of the at least one first chip;
  - a memory device, receiving and keeping the through silicon via status from the through silicon via detection circuit, wherein a control terminal of the memory device is coupled to a second signal input terminal;
  - a protection circuit, coupled to the memory device and the first end of the corresponding one of the at least two through silicon vias of the at least one first chip, determining whether or not to pull the first end of the corresponding one of the at least two through silicon vias of the at least one first chip to the ground voltage based on the through silicon via status kept by the memory device; and
  - a power control circuit, coupled to an between the power voltage and the input driving circuit and coupled to the memory device, providing the power voltage to the input driving circuit,
- wherein at least two input terminals of the output logic circuit of the at least one second chip are coupled to second ends of at the at least two through silicon vias of a chip which is stacked on the at least one second chip, respectively, and the output logic circuit of the at least one second chip generates an output signal according to signals from the at least two input terminals of the output logic circuit of the at least one second chip.

14. The through silicon via repair circuit as claimed in claim 13, wherein before the through silicon via repair circuit performs data transmission, the first signal input terminal inputs a detection driving signal, the through silicon via detection circuit detects the through silicon via status based on the detection driving signal, and the second signal input terminal inputs a memory trigger signal to trigger the memory device to keep the through silicon via status.

15. The through silicon via repair circuit as claimed in claim 14, wherein if the through silicon via status is defective, the power control circuit stops providing the power voltage to the input driving circuit, and the protection circuit pulls the first end of the corresponding one of the at least two through silicon vias of the at least one first chip to the ground voltage.

16. The through silicon via repair circuit as claimed in claim 13, wherein the power control circuit comprises:
- a first switch, wherein a first terminal of the first switch is coupled to the power voltage, a second terminal of the first switch is coupled to a power terminal of the input driving circuit, and a control terminal of the first switch is coupled to an output terminal of the memory device.

17. The through silicon via repair circuit as claimed in claim 13, wherein the protection circuit comprises:
- a second switch, wherein a first terminal of the second switch is coupled to the first end of the corresponding one of the at least two through silicon vias of the at least one first chip, a second terminal of the second switch is coupled to the ground voltage, and a control terminal of the second switch is coupled to an output terminal of the memory device.

18. The through silicon via repair circuit as claimed in claim 13, wherein the input driving circuit comprises:
- an inverter, wherein an input terminal of the inverter is coupled to the first signal input terminal, and an output terminal of the inverter is coupled to the first end of the corresponding one of the at least two through silicon vias of the at least one first chip.

19. The through silicon via repair circuit as claimed in claim 13, wherein the through silicon via detection circuit comprises:
- a first NOR gate, wherein a first input terminal of the first NOR gate is coupled to the first end of the corresponding one of the at least two through silicon vias of the at least one first chip, a second input terminal of the first NOR gate is coupled to the first signal input terminal, and an output terminal of the first NOR gate is coupled to an input terminal of the memory device.

20. The through silicon via repair circuit as claimed in claim 13, wherein the output logic circuit comprises:
- a second NOR gate, wherein at least two input terminals of the second NOR gate are coupled to the second ends of the at least two through silicon vias of the chip which is stacked on the at least one second chip, respectively.

21. The through silicon via repair circuit as claimed in claim 13, wherein the memory device comprises:
- a keeper;
- a third switch, wherein a first terminal of the third switch is coupled to an output terminal of the through silicon via detection circuit, a second terminal of the third switch is coupled to an input terminal of the keeper, and a control terminal of the third switch is coupled to the second signal input terminal; and
- a buffer, wherein an input terminal of the buffer is coupled to an output terminal of the keeper, and an output terminal of the buffer is coupled to the protection circuit.

22. The through silicon via repair circuit as claimed in claim 13, wherein the memory device comprises a latch, a D-type flip-flop or a non-volatile memory.

23. The through silicon via repair circuit as claimed in claim 13, wherein the at least two through silicon vias of each chip comprise at least one first through silicon via and at least one second through silicon via, the at least two data path circuits of the at least one first chip comprise a first data path circuit and a second data path circuit, the first data path circuit of the at least one first chip is coupled to a first end of the at least one first through silicon via of the at least one first chip, and the second data path circuit of the at least one first chip is coupled to a first end of the at least one second through silicon via of the at least one first chip.

24. The through silicon via repair circuit as claimed in claim 13, wherein the at least two through silicon vias of each chip comprise at least one first through silicon via, at least one second through silicon via and at least one third through silicon via, the at least two data path circuits of the at least one first chip comprise a first data path circuit, a second data path circuit and a third data path circuit, the first data path circuit of the at least one first chip is coupled to a first end of the at least one first through silicon via of the at least one first chip, the second data path circuit of the at least one first chip is coupled to a first end of the at least one second through silicon via of the at least one first chip, and the third data path circuit of the at least one first chip is coupled to a first end of the at least one third through silicon via of the at least one first chip.

25. The through silicon via repair circuit as claimed in claim 13, wherein each of second ends of the at least two through silicon vias of a chip which is stacked on the at least one second chip is coupled to a first end of a corresponding one of the at least two through silicon vias of the at least one second chip.

26. A through silicon repair circuit of a semiconductor device, comprising:
a plurality of chips, stacking in a single package, wherein each chip comprises at least two through silicon vias passing through a substrate of each chip, at least one first chip of the plurality of chips comprises at least two data path circuits, at least one second chip of the plurality of chips comprises an output logic circuit and at least two data path circuit, each of the at least two data path circuits of the at least one first chip is coupled to a corresponding one of the at least two through silicon vias of the at least one first chip, each of the at least two data path circuits of the at least one second chip is coupled to a corresponding one of the at least two through silicon vias of the at least one second chip, and each data path circuit comprises:
an input driving circuit, converting a signal input from a first signal input terminal based on a power voltage and a ground voltage and transmitting the signal to a first end of the corresponding one of the at least two through silicon vias;
a through silicon via detection circuit, coupled to the first signal input terminal and the first end of the corresponding one of the at least two through silicon vias, detecting a through silicon via status of the corresponding one of the at least two through silicon vias;
a memory device, receiving and keeping the through silicon via status from the through silicon via detection circuit, wherein a control terminal of the memory device is coupled to a second signal input terminal;
a protection circuit, coupled to the memory device and the first end of the corresponding one of the at least two through silicon vias, determining whether or not to pull the first end of the corresponding one of the at least two through silicon vias to the ground voltage; and
a power control circuit, coupled to an between the power voltage and the input driving circuit and coupled to the memory device, providing the power voltage to the input driving circuit,
wherein at least two input terminals of the output logic circuit of the at least one second chip are coupled to second ends of the at least two through silicon vias of a chip which is stacked on the at least one second chip, respectively, the output logic circuit of the at least one second chip generates an output signal according to signals from the at least two input terminals of the output logic circuit of the at least one second chip, and the output signal of the output logic circuit of the at least one second chip is coupled to the first signal input terminals of the at least two data path circuits of the at least one second chip.

* * * * *